United States Patent
Xiang et al.

(10) Patent No.: US 6,369,421 B1
(45) Date of Patent: *Apr. 9, 2002

(54) EEPROM HAVING STACKED DIELECTRIC TO INCREASE PROGRAMMING SPEED

(75) Inventors: Qi Xiang, Santa Clara; Xiao-yu Li, San Jose, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,177

(22) Filed: Jun. 29, 1998

(51) Int. Cl.[7] .............................................. H01L 29/788
(52) U.S. Cl. ....................................... 257/321; 257/411
(58) Field of Search ................................ 257/411, 321, 257/325

(56) References Cited

U.S. PATENT DOCUMENTS 4,924,278 A   5/1990   Logie ........................ 357/23.5
5,500,816 A * 3/1996   Kobayashi ................... 257/316
5,917,215 A * 6/1999   Chuang et al. .............. 257/321
6,087,696 A * 7/2000   Li et al. ..................... 257/321

FOREIGN PATENT DOCUMENTS

JP         3220777       *  9/1991   ................ 257/321

OTHER PUBLICATIONS

Japanese Kohai 3–220777 by Ishihara et al, 9/91, English translation.*

* cited by examiner

*Primary Examiner*—Mark V. Prenty

(57) ABSTRACT

An electrically erasable programmable read only memory (EEPROM) comprises a stacked dielectric tunnel oxide region formed between a write transistor and a sense transistor. The tunnel oxide region permits electron tunneling from a floating gate electrode of a sense transistor to the write transistor. The tunnel oxide region includes a first region that has a single dielectric layer optimized for data retention requirements. The tunnel oxide region also includes a second region having a stacked structure optimized for programming speed and comprising a relatively thin first dielectric layer and a second high-K dielectric layer formed thereon.

19 Claims, 4 Drawing Sheets

EEPROM HAVING STACKED DIELECTRIC TO INCREASE PROGRAMMING SPEED

TECHNICAL FIELD

The present invention relates to an electrically erasable programmable read only memory (EEPROM) device and a method of manufacturing an EEPROM.

BACKGROUND ART

The escalating requirements for high density and performance associated with EEPROMs require increased transistor and circuit speeds, high reliability and increased manufacturing throughput. In a conventional EEPROM device formed from a single layer of polysilicon schematically illustrated in FIG. 1, write transistor 2, read transistor 4 and sense transistor 6 form EEPROM memory cell 10. Drain and source contacts are represented by D and S, respectively.

Adverting to FIG. 1, word line WL is connected to the control gates of write transistor 2 and read transistor 4, respectively. Capacitor $C_t$ represents a tunnel oxide layer that capacitively couples the source region of write transistor 2 to floating gate electrode 8 of sense transistor 6. Capacitor $C_g$ represents a gate oxide layer that separates the source region of sense transistor 6 from floating gate electrode 8.

To write to EEPROM 10, i.e., program the memory, a programming voltage is first applied to word line WL, which turns on write and read transistors 2 and 4, respectively. By turning on transistor 2, a write signal applied to the drain of write transistor 2 is coupled to the source of write transistor 2. Similarly, when read transistor 4 is on, a read signal applied to the drain of read transistor 4 is coupled to the source of read transistor 4.

Next, to program sense transistor 6, a programming voltage is applied to the drain of write transistor 2, with the source of sense transistor 6 grounded. The programming voltage capacitively couples floating gate electrode 8 of sense transistor 6 to write transistor 2, due to the electric field created through $C_t$ and $C_g$.

The programming voltage is set to a sufficient level to cause electron tunneling from floating gate electrode 8 to the source of write transistor 2 through $C_t$, resulting in a net positive charge on floating gate electrode 8. The positive net charge is sufficient to turn on sense transistor 6 and results in a logical "1" indication during subsequent read operations.

For example, during a subsequent read operation, a voltage is applied to word line WL and a read voltage applied to the drain of read transistor 4, with both the drain of write transistor 2 and the source of sense transistor 6 grounded. A current then flows between the drain of read transistor 4 and the source of sense transistor 6, when sense transistor 6 is on, thereby resulting in the indication of a logical "1". When sense transistor 6 is not on, current does not flow and the read operation indicates a logical "0".

As design features continually shrink in size, it becomes more difficult to reduce the size of EEPROMs due to conventional data retention requirements of the EEPROM, e.g., ten year data retention requirement. In conventional EEPROMs, the data retention requirement is met by employing a silicon dioxide ($SiO_2$) tunnel oxide layer, represented by $C_t$ in FIG. 1, having a thickness of at least 90 Å.

The composition and thickness of the tunnel oxide layer directly affects the ability of electrons to tunnel from gate electrode 8 to the source of write transistor 2. More particularly, the tunnel oxide layer directly affects programming speed and programming voltages required to program sense transistor 6. One drawback attendant upon the data retention requirements of conventional EEPROMs is that the 90 Å $SiO_2$ tunnel oxide layer slows the programming speed of EEPROM 10 and raises the programming voltage required to program EEPROM 10.

Accordingly, there exists a need for an EEPROM device and a method of manufacturing an EEPROM device having increased programming speed.

SUMMARY OF THE INVENTION

An advantage of the present invention is an EEPROM having increased programming speed.

Another advantage of the present invention is a method of manufacturing an EEPROM device with increased programming speed.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a an EEPROM comprising a semiconductor substrate, a first transistor and a tunnel oxide layer formed on the semiconductor substrate. The EEPROM also includes a second transistor coupled to the first transistor through the tunnel oxide layer with the tunnel oxide layer including a first region and a second region, the first region comprising a first dielectric material and the second region including the first dielectric material and a second dielectric material formed on the first dielectric material.

Another aspect of the invention is a method of manufacturing an EEPROM. The method includes forming a write transistor comprising a source region and a drain region in a semiconductor substrate. The method also includes forming a sense transistor comprising a source region, a drain region, a gate oxide layer formed on the semiconductor substrate and a floating gate electrode formed on the gate oxide layer. The method further includes forming a tunnel oxide layer on the semiconductor substrate between the first transistor and the floating gate electrode of the second transistor with the tunnel oxide layer including a first region and a second region, the first region comprising a first dielectric material and the second region including the first dielectric material and a second dielectric material formed on the first dielectric material.

Other advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout.

DESCRIPTION OF THE INVENTION

The present invention addresses and solves problems associated with increasing EEPROM speed by scaling the tunnel oxide layer of the EEPROM. Embodiments of the present invention employ a tunnel oxide layer having two regions. A first region of the tunnel oxide layer comprises a material having a high dielectric constant (high-K) formed on a dielectric layer having a lower K, e.g., silicon oxide. A second region of the tunnel oxide layer comprises a single layer of the lower K material, e.g., silicon oxide. The inventive EEPROM device advantageously achieves increased programming speed while maintaining data retention requirements.

Figure 1:
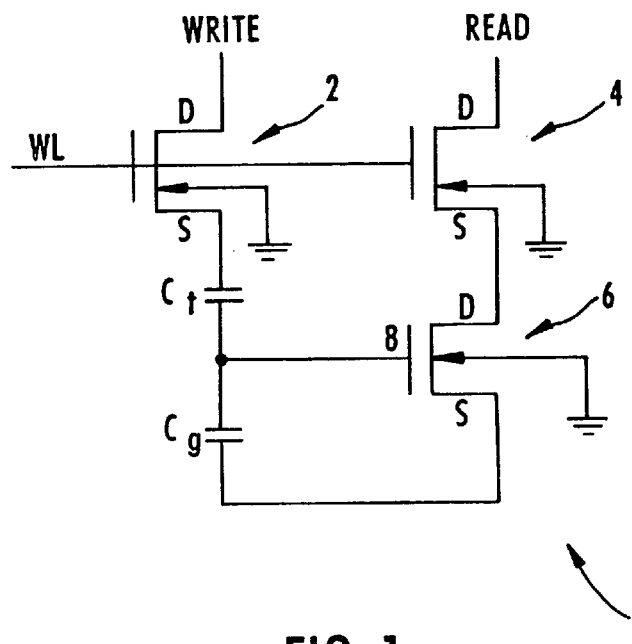
FIG. 1 is a schematic circuit diagram illustrating a conventional EEPROM.
Figure 2:
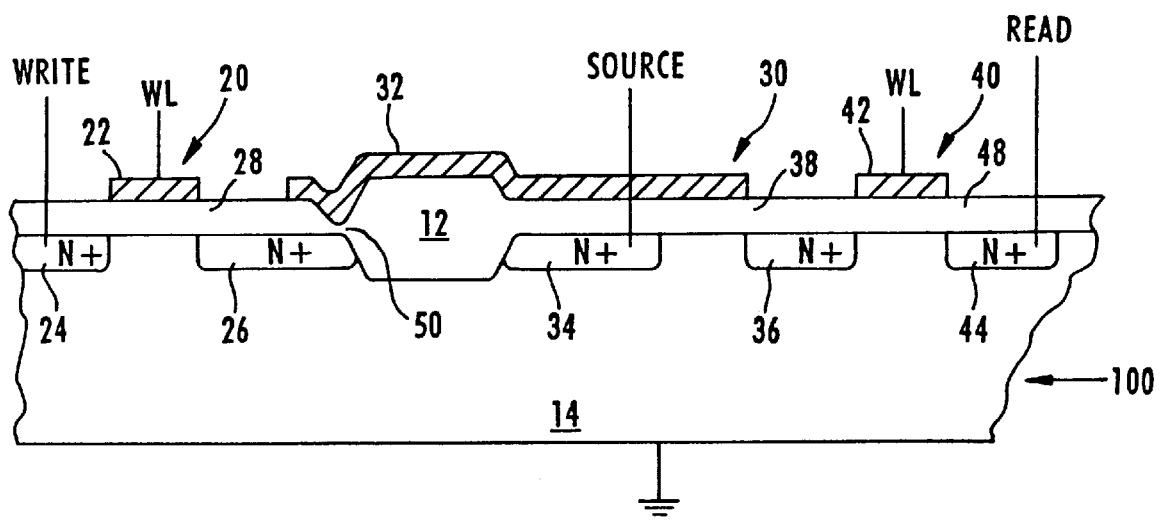
FIG. 2 illustrates the cross-section of an EEPROM according to an embodiment of the present invention.

FIG. 2 illustrates the cross-section of an EEPROM formed in accordance with an embodiment of the present invention. For illustrative purposes, the present invention will be described with substrate 14 comprising a P-type substrate. Alternatively, embodiments of the invention may utilize an N-type doped substrate.

Adverting to FIG. 2, field oxide region 12 is provided on semiconductor substrate 14, typically P-type doped monocrystalline silicon. Field oxide region 12 insulates subsequently formed floating gate electrode 32 from substrate 14 and separates subsequently formed write and sense transistors 20 and 30, respectively. A gate oxide layer, such as silicon dioxide, is formed on semiconductor substrate 14 to form gate oxide regions 28, 38 and 48, as shown in FIG. 2. The gate oxide regions insulate subsequently formed gate electrodes 22, 32 and 42 from substrate 14. Gate oxide regions 28, 38 and 48 are formed having a thickness of about 100 Å to about 200 Å. The individual thicknesses can be modified based on the individual design requirements for transistors 20, 30 and 40, respectively.

Figure 3A:
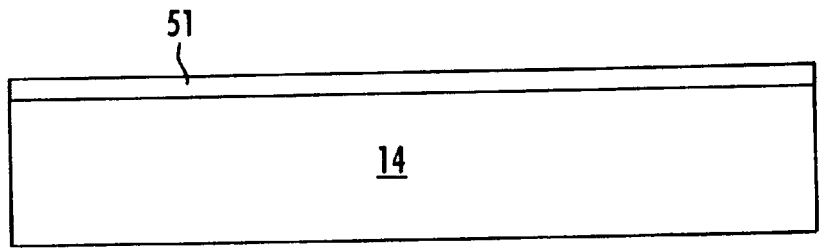
FIGS. 3A–3D illustrate the formation of a tunnel oxide layer according to an embodiment of the present invention.

The present invention departs from conventional methodology by forming tunnel oxide layer 50, located between floating gate electrode 32 of sense transistor 30 and source region 26 of write transistor 20, so that it comprises two distinct regions. Adverting to FIG. 3A, a layer of silicon oxide 51, such as silicon dioxide, is formed, e.g., by chemical vapor deposition (CVD), thermally grown or etching a previously deposited gate oxide layer, at a suitable thickness, e.g., of about 30 Å, on semiconductor substrate 14.

Figure 3B:
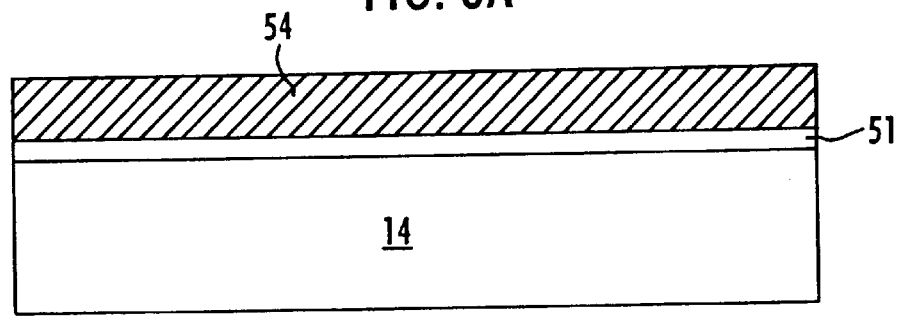

Subsequently, a layer of relatively high-K material 54, e.g., a K value about 10 or greater, is deposited over silicon oxide 51, as shown in FIG. 3B. For example, a high-K material such as a tantalum oxide, e.g., $Ta_2O_5$, is deposited over silicon oxide 51 having a thickness of about 200 Å. Alternatively, other high-K materials, such as titanium dioxide ($TiO_2$), aluminum oxide ($AL_2O_3$), silicon nitride ($Si_3N_4$), barium strontium titanate (BST), and lead zirconate titanate (PZT), can be deposited. Given the guidance and objectives disclosed herein, the thickness of the particular high-K dielectric deposited, as well as other application parameters, can be readily optimized in a particular situation to achieve the desired results, i.e., increase EEPROM programming speed.

Figure 3C:
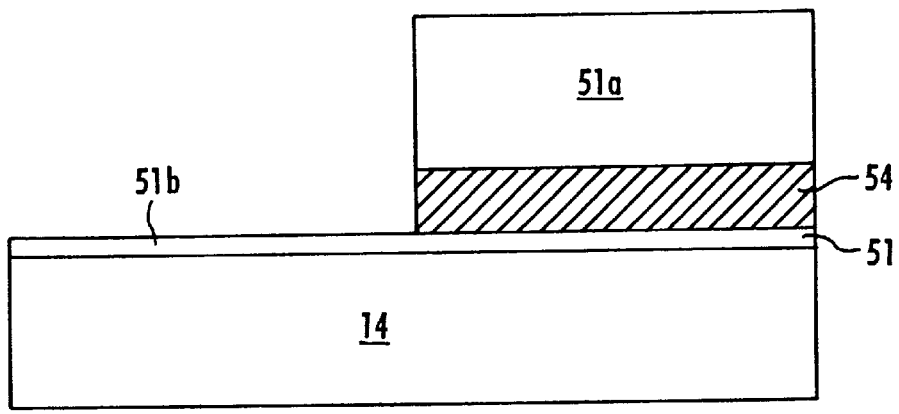
Figure 3D:
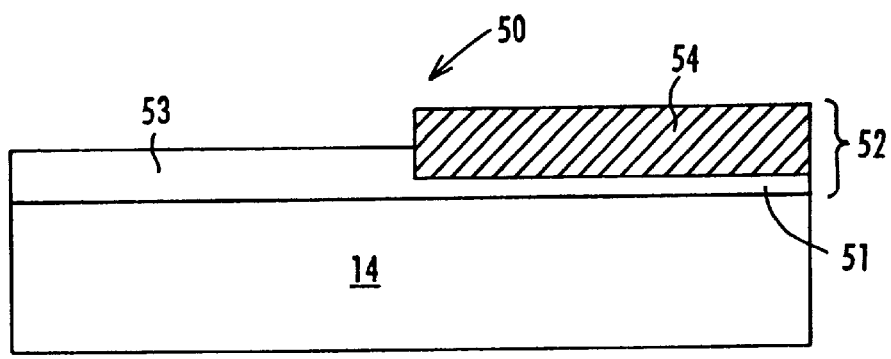

Subsequently, a resist mask 51a is formed over a portion, e.g., approximately one half, of the high-K material layer 54, as shown in FIG. 3C. Next, the high-K material layer 54 is strategically etched, employing a conventional etching technique, to remove the high-K material over non-masked region 51b of silicon oxide, as shown in FIG. 3C. Resist mask 51a is then stripped followed by a thermal oxidation to grow oxide thickness of region 51b to about 90 Å. The high-K material 54 acts as a mask during the thermal oxidation. Accordingly, there will be very little or no increase in oxide thickness underneath the high-K material 54. Alternatively, the thickness of region 51b can be increased to about 90 Å by CVD of silicon oxide. In either case, a laterally engineered composite tunnel oxide layer 50 is formed, as shown in FIG. 3D, including stacked dielectric region 52 comprising silicon oxide layer 51 and high-K material 54 formed thereon, and single dielectric region 53.

Figure 5:
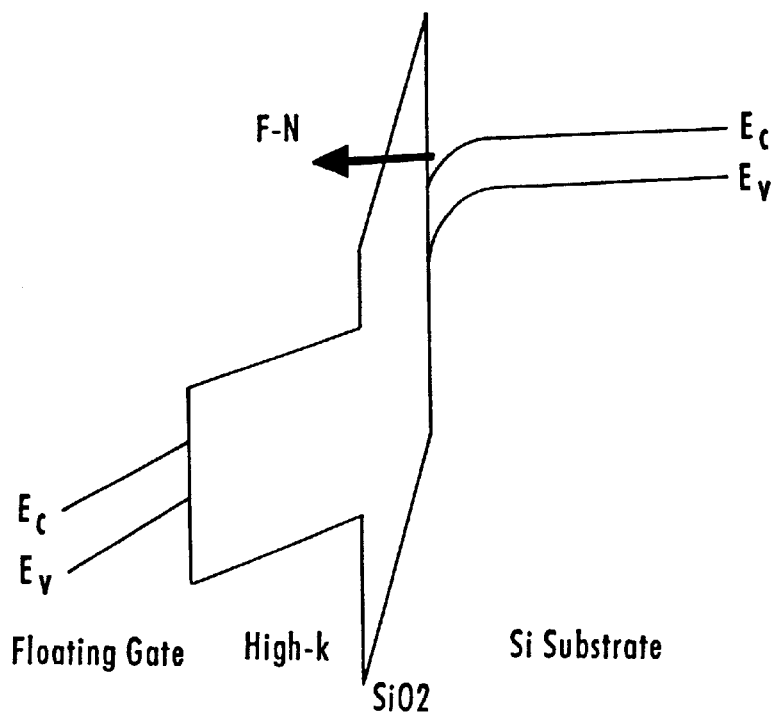
FIG. 5 is an energy band diagram of the tunnel oxide stacked dielectric region during programming of an EEPROM according to an embodiment of the present invention.
Figure 6:
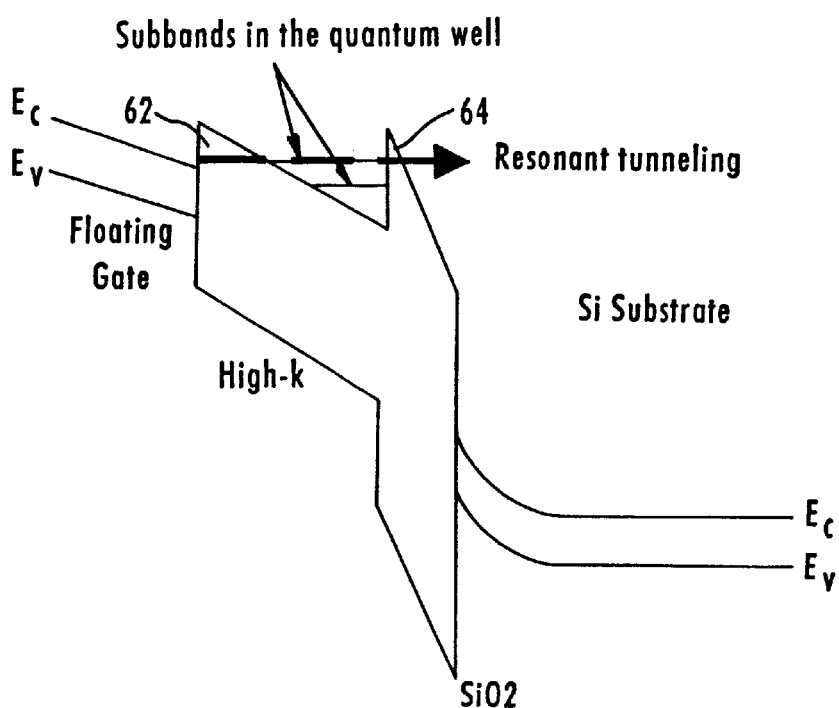
FIG. 6 is an energy band diagram of the tunnel oxide stacked dielectric region during erasing of an EEPROM according to an embodiment of the present invention.

Advantageously, the inventive composite tunnel oxide layer 50 results in increased programming speed, as discussed in detail below in connection with FIGS. 5 and 6, without sacrificing data retention. Additionally, the steps required to form tunnel oxide region 50 are easily implemented, thereby maintaining manufacturing throughput.

Adverting to FIG. 2, a conductive layer, e.g., doped polycrystalline silicon, is then deposited and patterned in a conventional manner to form floating gate electrode 32 of sense transistor 30, control gate 22 of write transistor 20 and control gate 42 of read transistor 40. Impurities are then ion implanted to form source and drain implants 24 and 26 for write transistor 20, source drain implants 34 and 36 for sense transistor 30 and source drain implants 36 and 44 for read transistor 40, as shown in FIG. 2. The particular impurity implanted depends on whether N-channel or P-channel transistors are to be formed.

In the exemplary embodiment employing a P-type substrate, an N-type impurity, such as phosphorous or arsenic, is implanted to form N-channel transistors. Alternatively, when an N-type substrate is employed, a P-type impurity, such as boron, can be implanted to form P-channel transistors. Additionally, the impurities are implanted at various dosages and implantation energies giving due consideration to both lateral and vertical diffusion of the implanted impurity during various subsequent manufacturing processing steps, e.g., activation annealing. The particular impurity chosen, as well as the implantation energy and dosage, is based on the particular design requirements. Subsequently, activation annealing is performed to activate the source/drain implants of transistors 20, 30 and 40.

Figure 4:
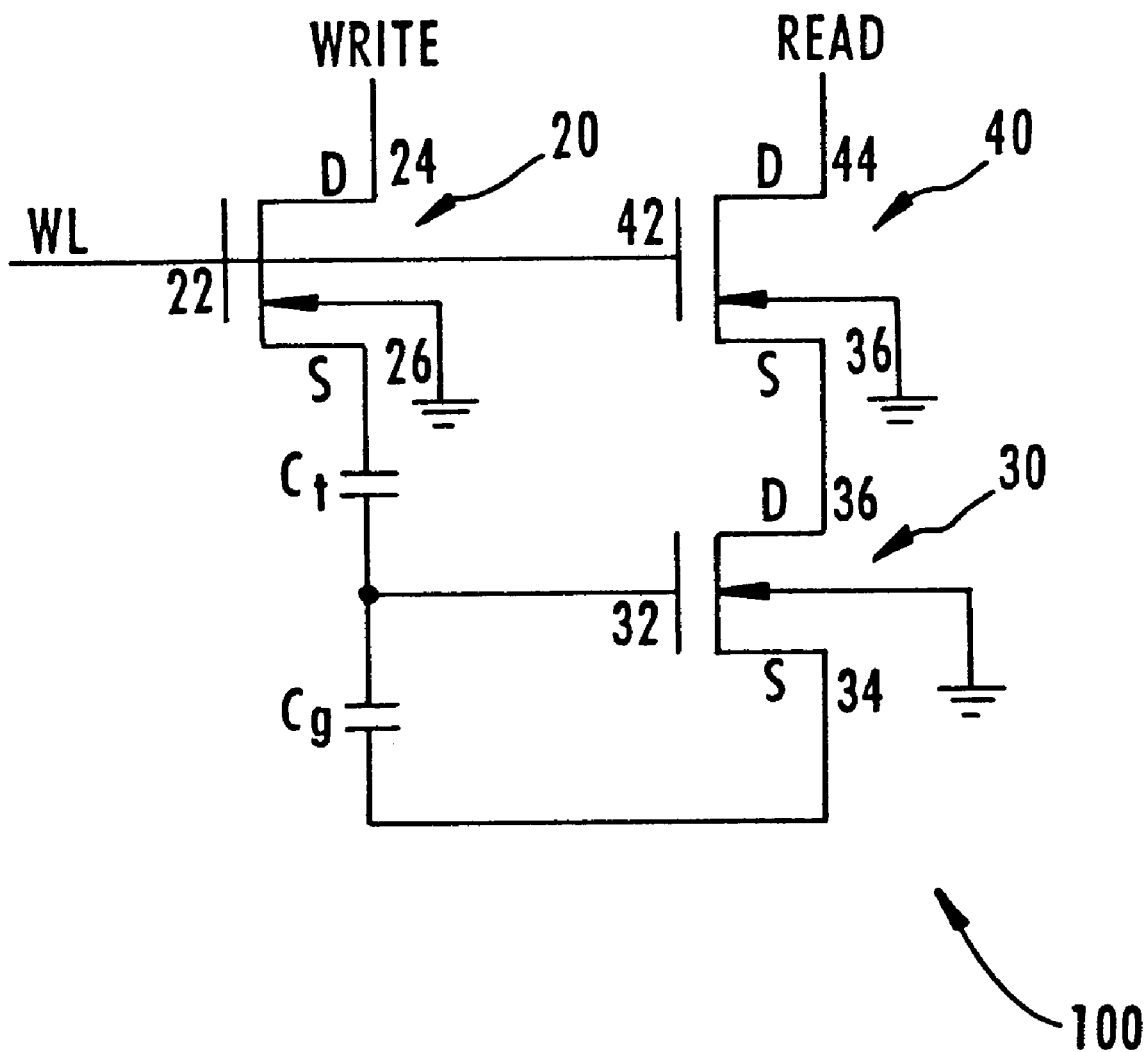
FIG. 4 is a schematic circuit diagram illustrating the EEPROM of FIG. 2.

FIG. 4 is a schematic circuit diagram illustrating EEPROM 100 of FIG. 2. Drain and source contacts are represented by D and S, respectively. The operation of EEPROM 100 will be described with reference to FIGS. 2–4. Adverting to FIG. 4, word line WL is connected to control gate 22 of write transistor 20 and control gate 42 of read transistor 40. Capacitor $C_t$ represents tunnel oxide layer 50 that capacitively couples source region 26 of write transistor 20 to floating gate electrode 32 of sense transistor 30. Capacitor $C_g$ represents gate oxide layer 38 that separates source region 24 from floating gate electrode 32.

To write to EEPROM 100, a programming voltage $V_{pp}$, is first applied to word line WL, which turns on write and read transistors 20 and 40, respectively. Next, to program sense transistor 30, programming voltage $V_{pp}$, i.e., a write signal, is applied to drain 24 of write transistor 20, with both source 34 of sense transistor 30 and drain 44 of read transistor 40 grounded. The programming voltage capacitively couples floating gate electrode 32 to write transistor 20, due to the electric field created through $C_t$ and $C_g$.

Programming voltage $V_{pp}$ is set to a sufficient level to cause electron tunneling from floating gate electrode 32 to source 26 of write transistor 20 through $C_t$, resulting in a net positive charge on floating gate electrode 32. The positive net charge is sufficient to turn on sense transistor 30 and results in a logical "1" indication during subsequent read operations.

For example, during a subsequent read operation, an operating voltage $V_{cc}$, which is typically less than $V_{pp}$, is applied to word line WL and a voltage $V_{sense}$, typically $V_{cc}/2$, is applied to drain 44 of read transistor 40, with both drain 24 of write transistor 20 and source 34 of sense transistor 30 grounded. A current then flows between drain 44 and source 34, when sense transistor 30 is on, thereby resulting in the indication of a logical "1". When sense transistor 30 is not on, current does not flow and the read operation indicates a logical "0".

To erase EEPROM 100, programming voltage $V_{pp}$ is applied to word line WL, as well as to source 34 of sense transistor 30 and drain 44 of read transistor 40, with drain 24 of write transistor 20 grounded. The voltage at source 34 capacitively couples source 34 to floating gate electrode 32. The voltage difference between source 26 of write transistor 20 and gate electrode 32 causes electrons from source 26 to tunnel through tunnel oxide region 50, resulting in a net negative charge on floating gate electrode 32. This net negative charge is sufficient to turn sense transistor 30 off and results in a logical "0" indication during subsequent read operations.

As discussed previously, the programming speed of an EEPROM is based on the composition of the tunnel oxide region. FIG. 5 represents an energy band diagram of stacked dielectric region 52 of tunnel oxide layer 50 during programming. The area above $E_c$ represents the conduction band and the area below $E_v$ represents the valence band. The programming of EEPROM 100 will be described with reference to FIGS. 3D and 5.

The programming speed of EEPROM 100 is determined by which region of tunnel oxide layer 50 has more efficient Fowler-Nordheim (F-N) tunneling. Adverting to FIG. 5, electrons only encounter the $SiO_2$ barrier in stacked dielectric region 52 of tunnel oxide layer 50 and do not encounter the high-K barrier during F-N tunneling. Since the $SiO_2$ layer in stacked dielectric region 52 is much thinner than single $SiO_2$ layer 53, the programming speed will be determined by the thin $SiO_2$ layer in stacked dielectric region 52.

Advantageously, the time for electron tunneling to proceed and provide a positive net charge on gate electrode 32 to turn on transistor 30 is reduced, when compared to employing a single tunnel oxide layer of $SiO_2$ having a thickness of at least 90 Å.

EEPROM 100 satisfies at least the ten year data retention requirement for data storage. Data retention of EEPROM 100 is determined by which region of tunnel oxide layer 50 has higher leakage current density. Since silicon oxide region 53 has a higher leakage current density than stacked dielectric region 52, a minimum ten year data retention requirement is met by silicon oxide region 53.

Erasing speed of EEPROM 100 is determined by whichever region of tunnel oxide layer 50 has more efficient tunneling. FIG. 6 represents an energy band diagram of stacked dielectric region 52 of tunnel oxide layer 50 during erasing. Adverting to FIG. 6, electrons in the floating gate electrode encounter two triangular barriers, high-K barrier 62 with a lower height but greater width than $SiO_2$ barrier 64. It has been found that if the high-K layer in stacked dielectric region 52 is thin, e.g., less than about 150 Å, a triangle quantum well is formed at the high-K/$SiO_2$ interface and subbands are formed in this triangle quantum well, as shown in FIG. 6. With the subbands in the quantum well, resonant tunneling occurs and the tunneling current is greatly enhanced. In other words, a total tunneling probability much larger than the product of tunneling probabilities through two barriers due to the F-N tunneling mechanism occurs. However, in order to suppress leakage current while having efficient programming, a relatively thick high-K layer and relatively thin $SiO_2$ layer are employed, as illustrated in FIG. 3D. As a result, tunneling probability during the erasing will be small due to thick high-K layer. Accordingly, the erasing speed of EEPROM 100 is determined by single $SiO_2$ layer 53.

According to another aspect of the present invention, a stacked dielectric, similar to tunnel oxide region 52 shown in FIG. 3D, is employed to reduce space requirements on a chip for EEPROM 100. For example, a stacked dielectric is employed as gate oxide layer for read transistor 40. That is, gate oxide layer 48 comprises a thin layer of $SiO_2$ with a high-K dielectric, such as a tantalum oxide, deposited thereon. The resulting gate oxide layer has a structure similar to stacked dielectric part 52, shown in FIG. 3D. In this manner, since the capacitance of the stacked dielectric is high, the gate length of gate electrode 42 can be reduced, while maintaining the same or higher read current. Advantageously, this structure reduces chip layout area. Similarly, write transistor 20 can employ a similar stacked dielectric part to function as the gate oxide layer and further reduce chip layout area.

In accordance with the embodiment of the invention illustrated in FIG. 2, the present invention advantageously enables the formation of a tunnel oxide layer in EEPROMs employing a single polysilicon layer. The present invention can also be employed in other EEPROM devices that utilize a single polysilicon layer and rely on electron tunneling for programming. Alternatively, the present invention can be utilized in EEPROMs having two or more silicon layers.

For example, EEPROMs often employ a second silicon layer formed above a floating gate electrode to function as a control gate, as illustrated in FIG. 4 of U.S. Pat. No. 4,924,278, assigned to the assignee of the present invention, the entire disclosure of which is incorporated herein by reference. The formation of tunnel oxide region illustrated in FIG. 3D of the present disclosure can be advantageously employed in such EEPROMs to increase programming speed without sacrificing data retention.

The present invention decouples programming of an EEPROM from data retention and erasing by forming a tunnel oxide layer comprising two separate regions. Programming speed is advantageously optimized using a thin silicon oxide layer in the stacked dielectric region. Additionally, data retention and speed of erasing are advantageously optimized by the single layer of silicon oxide in the non-stacked region, thereby satisfying at least the ten year data retention requirement of conventional EEPROMs. Thus, in accordance with the present invention, an EEPROM achieves increased programming speed while maintaining data retention requirements. Additionally, the present invention is applicable to the production of various types of EEPROMs, particularly high density EEPROMs with submicron features, e.g., less than about 0.18 microns. The present invention is cost effective and can easily be integrated into conventional processing.

In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. An EEPROM comprising:
   a semiconductor substrate;
   a first transistor;
   a tunnel oxide layer formed on the semiconductor substrate; and
   a second transistor coupled to the first transistor through the tunnel oxide layer, wherein the tunnel oxide layer includes a first region and a second region, the first region comprising a first dielectric material and the second region comprising the first dielectric material and a second dielectric material, different from the first dielectric material, formed on the first dielectric material; wherein
   the first region of the tunnel oxide layer is thinner than the second region of the tunnel oxide layer; and
   the second dielectric material is formed only on a portion of the first dielectric material.

2. The EEPROM of claim 1, wherein:
   the first transistor comprises a source region and a drain region formed in the semiconductor substrate and a control gate formed on the semiconductor substrate, and the second transistor comprises a source region and a drain region formed in the semiconductor substrate, a gate oxide layer formed on the semiconductor substrate and a floating gate electrode formed on the gate oxide layer.

3. The EEPROM of claim 1, wherein the first dielectric material has a lower dielectric constant than that of the second dielectric material.

4. The EEPROM of claim 3, wherein the thickness of the first dielectric material in the first region is greater than the thickness of the first dielectric material in the second region.

5. An EEPROM comprising:
   a semiconductor substrate;
   a first transistor;
   a tunnel oxide layer formed on the semiconductor substrate; and
   a second transistor coupled to the first transistor through the tunnel oxide layer, wherein:
   the tunnel oxide layer includes a first region and a second region, the first region comprising a first dielectric material and the second region comprising the first dielectric material and a second dielectric material, different from the first dielectric material, formed on the first dielectric material;
   the second dielectric material is formed only on a portion of the first dielectric material;
   the first dielectric material has a lower dielectric constant than that of the second dielectric material;
   the thickness of the first dielectric material in the first region is greater than the thickness of the first dielectric material in the second region; and
   the first dielectric material has a thickness of about 90 Å in the first region and has a thickness of about 30 Å in the second region.

6. The EEPROM of claim 3, wherein the first dielectric material comprises silicon dioxide.

7. The EEPROM of claim 6, wherein the second dielectric material comprises a tantalum oxide.

8. An EEPROM comprising:
   a semiconductor substrate;
   a first transistor;
   a tunnel oxide layer formed on the semiconductor substrate; and
   a second transistor coupled to the first transistor through the tunnel oxide layer, wherein:
   the tunnel oxide layer includes a first region and a second region, the first region comprising a first dielectric material and the second region comprising the first dielectric material and a second dielectric material, different from the first dielectric material, formed on the first dielectric material;
   the second dielectric material is formed only on a portion of the first dielectric material;
   the first dielectric material has a lower dielectric constant than that of the second dielectric material;
   the first dielectric material comprises silicon dioxide;
   the second dielectric material comprises a tantalum oxide; and the tantalum oxide has a thickness of about 200 Å.

9. The EEPROM of claim 1, wherein the second dielectric material has a dielectric constant of about ten or greater.

10. An EEPROM comprising:
    a semiconductor substrate;
    a first transistor having a source region and a drain region formed in the semiconductor substrate, a gate oxide layer formed on the semiconductor substrate and a control gate formed on the gate oxide layer;
    a second transistor comprising a source region and a drain region formed in the semiconductor substrate, a gate oxide layer formed on the semiconductor substrate and a floating gate electrode formed on the gate oxide layer;
    a third transistor having a source region and a drain region formed in the semiconductor substrate, a gate oxide layer formed on the semiconductor substrate and a control gate formed on the gate oxide layer; and
    a tunnel oxide layer disposed between the source region of the first transistor and the floating gate electrode of the second transistor, wherein the tunnel oxide layer includes a first region and a second region, the first region comprising a first dielectric material and the second region comprising the first dielectric material and a second dielectric material, different from the first dielectric material, formed on the first dielectric material; wherein
    the first region of the tunnel oxide layer is thinner than the second region of the tunnel oxide layer; and
    the second dielectric material is formed only on a portion of the first dielectric material.

11. The EEPROM of claim 10, wherein the first dielectric material comprises silicon dioxide and the second dielectric material has a dielectric constant of about ten or greater.

12. The EEPROM of claim 10, wherein the second dielectric material comprises a tantalum oxide, titanium oxide, aluminum oxide, silicon nitride, BST or PZT.

13. The EEPROM of claim 10, wherein the thickness of the first dielectric material in the first region is greater than the thickness of the first dielectric material in the second region.

14. An EEPROM comprising:
a semiconductor substrate;
a first transistor having a source region and a drain region formed in the semiconductor substrate, a gate oxide layer formed on the semiconductor substrate and a control gate formed on the gate oxide layer;
a second transistor comprising a source region and a drain region formed in the semiconductor substrate, a gate oxide layer formed on the semiconductor substrate and a floating gate electrode formed on the gate oxide layer;
a third transistor having a source region and a drain region formed in the semiconductor substrate, a gate oxide layer formed on the semiconductor substrate and a control gate formed on the gate oxide layer; and
a tunnel oxide layer disposed between the source region of the first transistor and the floating gate electrode of the second transistor, wherein the tunnel oxide layer includes a first region and a second region, the first region comprising a first dielectric material and the second region comprising the first dielectric material and a second dielectric material, different from the first dielectric material, formed on the first dielectric material; wherein
the second dielectric material is formed only on a portion of the first dielectric material;
the thickness of the first dielectric material in the first region is greater than the thickness of the first dielectric material in the second region; and
the first dielectric material has a thickness of about 90 Å in the first region and has a thickness of about 30 Å in the second region.

15. The EEPROM of claim 14, wherein the second dielectric material comprises a tantalum oxide and has a thickness of about 200 Å.

16. An EEPROM comprising:
a semiconductor substrate;
a first transistor having a source region and a drain region formed in the semiconductor substrate, a gate oxide layer formed on the semiconductor substrate and a control gate formed on the gate oxide layer;
a second transistor comprising a source region and a drain region formed in the semiconductor substrate, a gate oxide layer formed on the semiconductor substrate and a floating gate electrode formed on the gate oxide layer;
a third transistor having a source region and a drain region formed in the semiconductor substrate, a gate oxide layer formed on the semiconductor substrate and a control gate formed on the gate oxide layer; and
a tunnel oxide layer disposed between the source region of the first transistor and the floating gate electrode of the second transistor, wherein the tunnel oxide layer includes a first region and a second region, the first region comprising a first dielectric material and the second region comprising the first dielectric material and a second dielectric material, different from the first dielectric material, formed on the first dielectric material; wherein
the second dielectric material is formed only on a portion of the first dielectric material; and
the gate oxide layer of at least one of the first transistor and the third transistor comprises a layer of silicon dioxide and a third dielectric material formed on the silicon dioxide.

17. The EEPROM of claim 16, wherein the third dielectric material has a dielectric constant of about ten or greater.

18. The EEPROM of claim 17, wherein the third dielectric material comprises a tantalum oxide, a titanium dioxide, an aluminum oxide, a silicon nitride, a BST or a PZT.

19. The EEPROM of claim 6, wherein the second dielectric material comprises a tantalum oxide, titanium oxide, aluminum oxide, silicone nitride, BST, or PZT.

* * * * *